United States Patent
Matsushita et al.

(10) Patent No.: US 12,520,569 B2
(45) Date of Patent: Jan. 6, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kenichi Matsushita, Nonoichi Ishikawa (JP); Mitsuhiko Kitagawa, Nomi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 578 days.

(21) Appl. No.: 17/689,850

(22) Filed: Mar. 8, 2022

(65) Prior Publication Data

US 2023/0090328 A1 Mar. 23, 2023

(30) Foreign Application Priority Data

Sep. 22, 2021 (JP) .................. 2021-154349

(51) Int. Cl.
*H10D 84/60* (2025.01)
*H10D 8/00* (2025.01)
(Continued)

(52) U.S. Cl.
CPC .......... *H10D 84/617* (2025.01); *H10D 8/422* (2025.01); *H10D 12/481* (2025.01); *H10D 62/393* (2025.01)

(58) Field of Classification Search
CPC .............. H01L 29/7395; H01L 29/872; H01L 29/8083; H01L 29/861; H01L 29/7802;
(Continued)

(56) References Cited

U.S. PATENT DOCUMENTS 8,686,469 B2  4/2014  Nakamura
9,520,465 B2  12/2016  Yamashita et al.
(Continued)

FOREIGN PATENT DOCUMENTS

JP  H07-313427 A  11/1995
JP  2007-0019518 A  1/2007
(Continued)

OTHER PUBLICATIONS

Office Action received in Japanese Application No. 2021-154349 dated May 10, 2024 in 13 pages.

*Primary Examiner* — Britt D Hanley
*Assistant Examiner* — Jason James Greaving
(74) *Attorney, Agent, or Firm* — Knobbe, Martens, Olson & Bear, LLP

(57) ABSTRACT

A semiconductor device includes: a first semiconductor layer located in a diode region, the first semiconductor layer including a plurality of first semiconductor regions and a plurality of second semiconductor regions alternately arranged in a first direction; a second semiconductor layer located in the IGBT region; and a third semiconductor layer located on the first semiconductor layer in the diode region, an impurity concentration of the third semiconductor layer having a maximum at a first position in a second direction, an impurity concentration of the first semiconductor region having a maximum at a second position in the second direction, a third position being separated from the upper surface of the first electrode by a length that is 3 times a distance between the second position and a lower end of the third semiconductor layer, the first position being the same as or lower than the third position.

13 Claims, 8 Drawing Sheets

(51) Int. Cl.
*H10D 12/00* (2025.01)
*H10D 62/17* (2025.01)

(58) Field of Classification Search
CPC .............. H01L 29/7827; H01L 29/7804; H01L 29/7805; H01L 29/0619; H01L 29/36; H01L 29/0638; H10D 12/441; H10D 30/831; H10D 8/60; H10D 62/106; H10D 62/60; H10D 62/10; H10D 62/13; H10D 84/617; H10D 8/422
See application file for complete search history.

(56) References Cited

U.S. PATENT DOCUMENTS

| | | | |
|---|---|---|---|
| 9,601,639 B2 | 3/2017 | Masuoka et al. | |
| 10,026,803 B1 | 7/2018 | Nakamura | |
| 2010/0258840 A1* | 10/2010 | Schulze | H10D 62/141 257/E29.197 |
| 2010/0308446 A1 | 12/2010 | Nakamura | |
| 2012/0068221 A1* | 3/2012 | Kitagawa | H01L 29/868 257/E29.198 |
| 2012/0132954 A1 | 5/2012 | Kouno et al. | |
| 2014/0048847 A1 | 2/2014 | Yamashita et al. | |
| 2015/0155277 A1* | 6/2015 | Ogura | H01L 29/861 257/140 |
| 2015/0311279 A1* | 10/2015 | Onozawa | H01L 29/32 438/530 |
| 2016/0351561 A1 | 12/2016 | Senoo | |
| 2017/0025551 A1 | 1/2017 | Yamwong | |
| 2018/0083097 A1 | 3/2018 | Baburske et al. | |
| 2019/0088799 A1* | 3/2019 | Mauder | H01L 29/36 |
| 2020/0058506 A1 | 2/2020 | Nakamura | |
| 2021/0050345 A1* | 2/2021 | Tamura | H01L 29/8725 |
| 2022/0013634 A1* | 1/2022 | Nitta | H01L 29/0619 |

FOREIGN PATENT DOCUMENTS

| | | |
|---|---|---|
| JP | 2010-0283132 A | 12/2010 |
| JP | 2012-0129504 A | 7/2012 |
| JP | 2013-048230 A | 3/2013 |
| JP | 2013-051345 A | 3/2013 |
| JP | 2013-051346 A | 3/2013 |
| JP | 2014-241433 A | 12/2014 |
| JP | 2016-006890 A | 1/2016 |
| JP | 2016-086136 A | 5/2016 |
| JP | 2016-0225345 A | 12/2016 |
| JP | 2017-028055 A | 2/2017 |
| JP | 2018-107479 A | 7/2018 |
| JP | 2020-027921 A | 2/2020 |

\* cited by examiner

SEMICONDUCTOR DEVICE

CROSS-REFERENCE TO RELATED APPLICATIONS

This application is based upon and claims the benefit of priority from Japanese Patent Application No. 2021-154349, filed on Sep. 22, 2021; the entire contents of which are incorporated herein by reference.

FIELD

Embodiments relate to a semiconductor device.

BACKGROUND

A RC-IGBT (Reverse Conducting-IGBT) in which a diode region and an IGBT (Insulated Gate Bipolar Transistor) region are set is conventionally known. In an RC-IGBT, a return current from the emitter side toward the collector side of the IGBT region can be caused to flow in the diode region.

DETAILED DESCRIPTION

Figure 1:
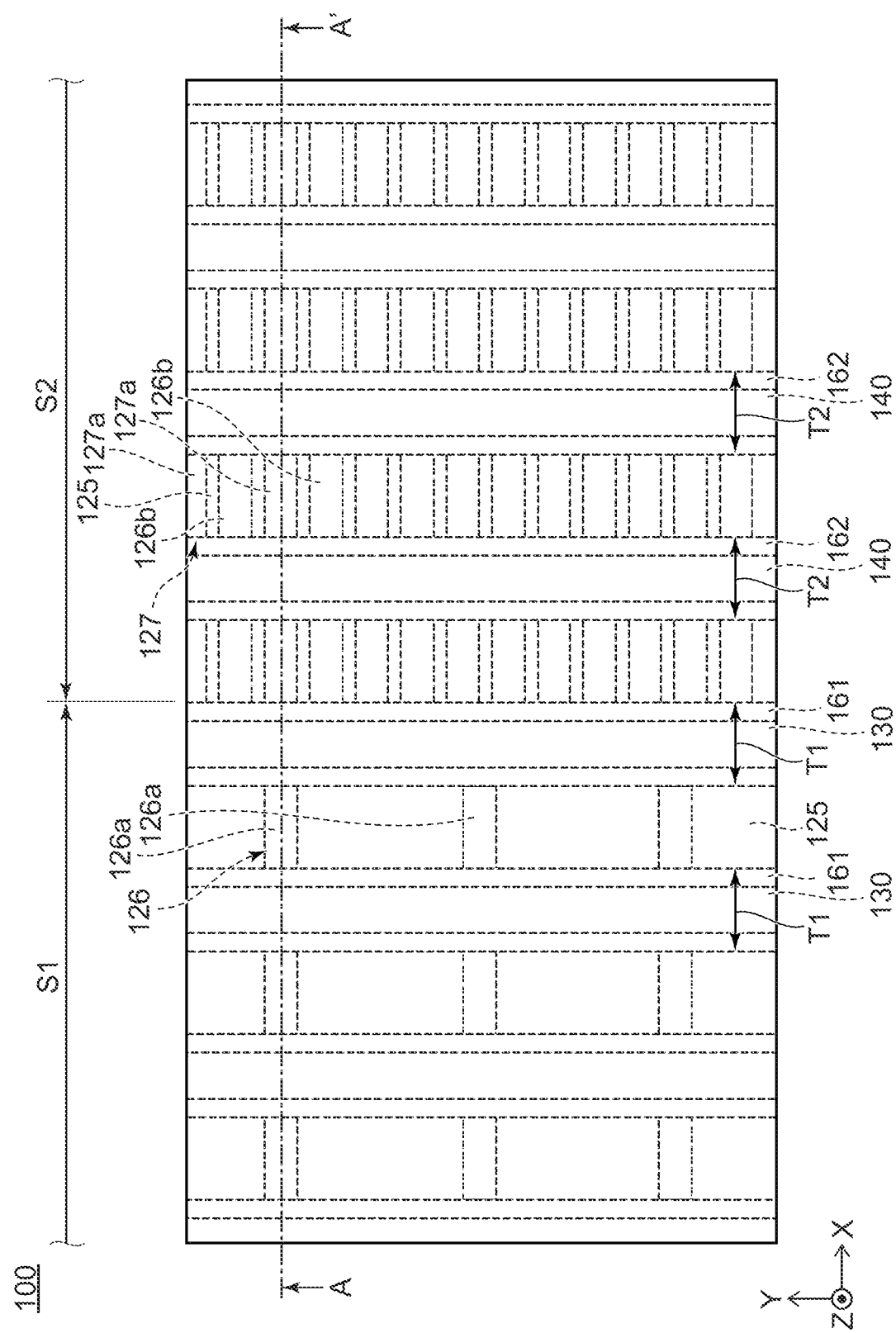
FIG. 1 is a top view showing a semiconductor device according to a first embodiment.

In general, according to one embodiment, a semiconductor device in which a diode region and an IGBT region are set, the device includes: a first electrode located in the diode region and the IGBT region; a first semiconductor layer located on the first electrode in the diode region, the first semiconductor layer including a plurality of first semiconductor regions and a plurality of second semiconductor regions alternately arranged in a first direction along an upper surface of the first electrode, the plurality of first semiconductor regions being of a first conductivity type, the plurality of second semiconductor regions being of a second conductivity type; a second semiconductor layer located on the first electrode in the IGBT region, the second semiconductor layer being of the second conductivity type; a third semiconductor layer located on the first semiconductor layer in the diode region, the third semiconductor layer being of the first conductivity type, an impurity concentration of the third semiconductor layer having a maximum at a first position in a second direction, the second direction being from the first electrode toward the first semiconductor layer, an impurity concentration of the first semiconductor region having a maximum at a second position in the second direction, a third position being separated from the upper surface of the first electrode by a length that is 3 times a distance between the second position and a lower end of the third semiconductor layer, the first position being the same as or lower than the third position; a fourth semiconductor layer located on the third semiconductor layer in the diode region and located higher than the second semiconductor layer in the IGBT region, the fourth semiconductor layer being of the first conductivity type; a fifth semiconductor layer located on the fourth semiconductor layer in the diode region and the IGBT region, the fifth semiconductor layer being of the second conductivity type; a sixth semiconductor layer located on the fifth semiconductor layer in the IGBT region, the sixth semiconductor layer being of the first conductivity type; a second electrode extending from the sixth semiconductor layer toward the fourth semiconductor layer in the IGBT region, the second electrode being next to the sixth semiconductor layer, the fifth semiconductor layer, and the fourth semiconductor layer; a third electrode located on the fifth semiconductor layer in the diode region and located on the sixth semiconductor layer in the IGBT region; and an insulating film located between the second electrode and the third electrode, between the second electrode and the sixth semiconductor layer, between the second electrode and the fifth semiconductor layer, and between the second electrode and the fourth semiconductor layer.

In general, according to one embodiment, a semiconductor device in which a diode region and an IGBT region are set, the device includes: a first electrode located in the diode region and the IGBT region; a first semiconductor layer located on the first electrode in the diode region, at least a portion of the first semiconductor layer being transparent, the first semiconductor layer being of a first conductivity type; a second semiconductor layer located on the first electrode in the IGBT region, the second semiconductor layer being of a second conductivity type; a third semiconductor layer located on the first semiconductor layer in the diode region and located on the second semiconductor layer in the IGBT region, the third semiconductor layer being of the first conductivity type; a fourth semiconductor layer located on the third semiconductor layer in the diode region and the IGBT region, the fourth semiconductor layer being of the second conductivity type; a fifth semiconductor layer located on the fourth semiconductor layer in the IGBT region, the fifth semiconductor layer being of the first conductivity type; a second electrode extending from the fifth semiconductor layer toward the third semiconductor layer in the IGBT region, the second electrode being next to the fifth semiconductor layer, the fourth semiconductor layer, and the third semiconductor layer; a third electrode located on the fourth semiconductor layer in the diode region and located on the fifth semiconductor layer in the IGBT region; and an insulating film located between the second electrode and the third electrode, between the second electrode and the fifth semiconductor layer, between the second electrode and the fourth semiconductor layer, and between the second electrode and the third semiconductor layer.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described in regard to a drawing thereinabove are marked with like reference numerals, and a detailed description is omitted as appropriate.

For easier understanding of the following description, the arrangements and configurations of the portions are described using an XYZ orthogonal coordinate system. An X-axis, a Y-axis, and a Z-axis are orthogonal to each other. The direction in which the X-axis extends is taken as an "X-direction"; the direction in which the Y-axis extends is taken as a "Y-direction"; and the direction in which the Z-axis extends is taken as a "Z-direction". Although the direction of the arrow in the Z-direction is taken as up and the opposite direction is taken as down for easier understanding of the description, these directions are independent of the direction of gravity.

Hereinbelow, the notations of + and − indicate relative levels of the impurity concentrations of each conductivity type. Specifically, a notation marked with "+" indicates a higher maximum value of the impurity concentration than a notation not marked with either "+" or "−". A notation marked with "−" indicates a lower maximum value of the impurity concentration than a notation not marked with either "+" or "−". Here, when both an impurity that forms donors and an impurity that forms acceptors are included in each region, the "impurity concentration" means the net impurity concentration after the impurities cancel.

First Embodiment

First, a first embodiment will be described.

FIG. 1 is a top view showing a semiconductor device according to the embodiment.

Figure 2:
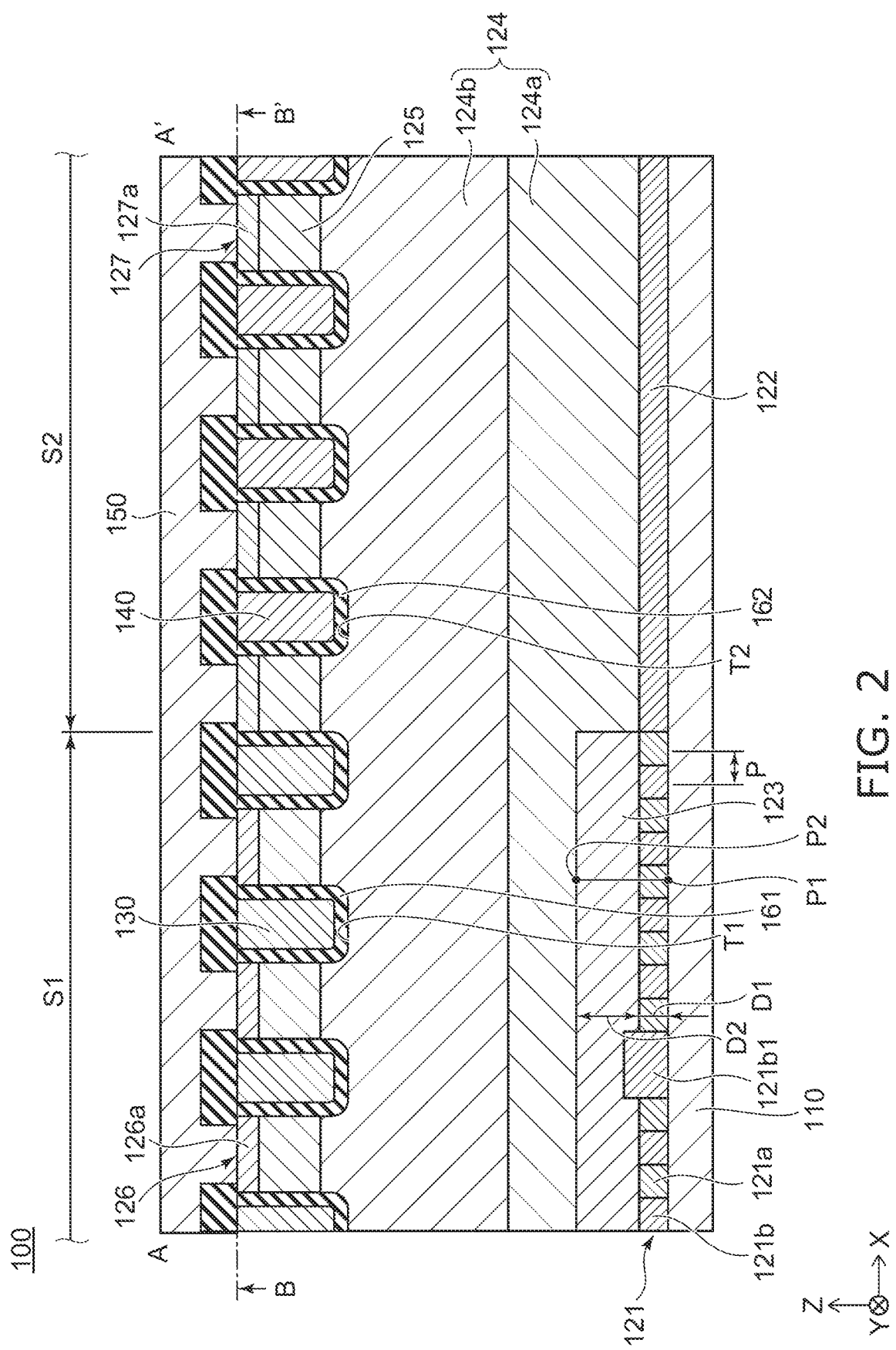
FIG. 2 is a cross-sectional view along line A-A' of FIG. 1.

FIG. 2 is a cross-sectional view along line A-A' of FIG. 1.

Figure 3:
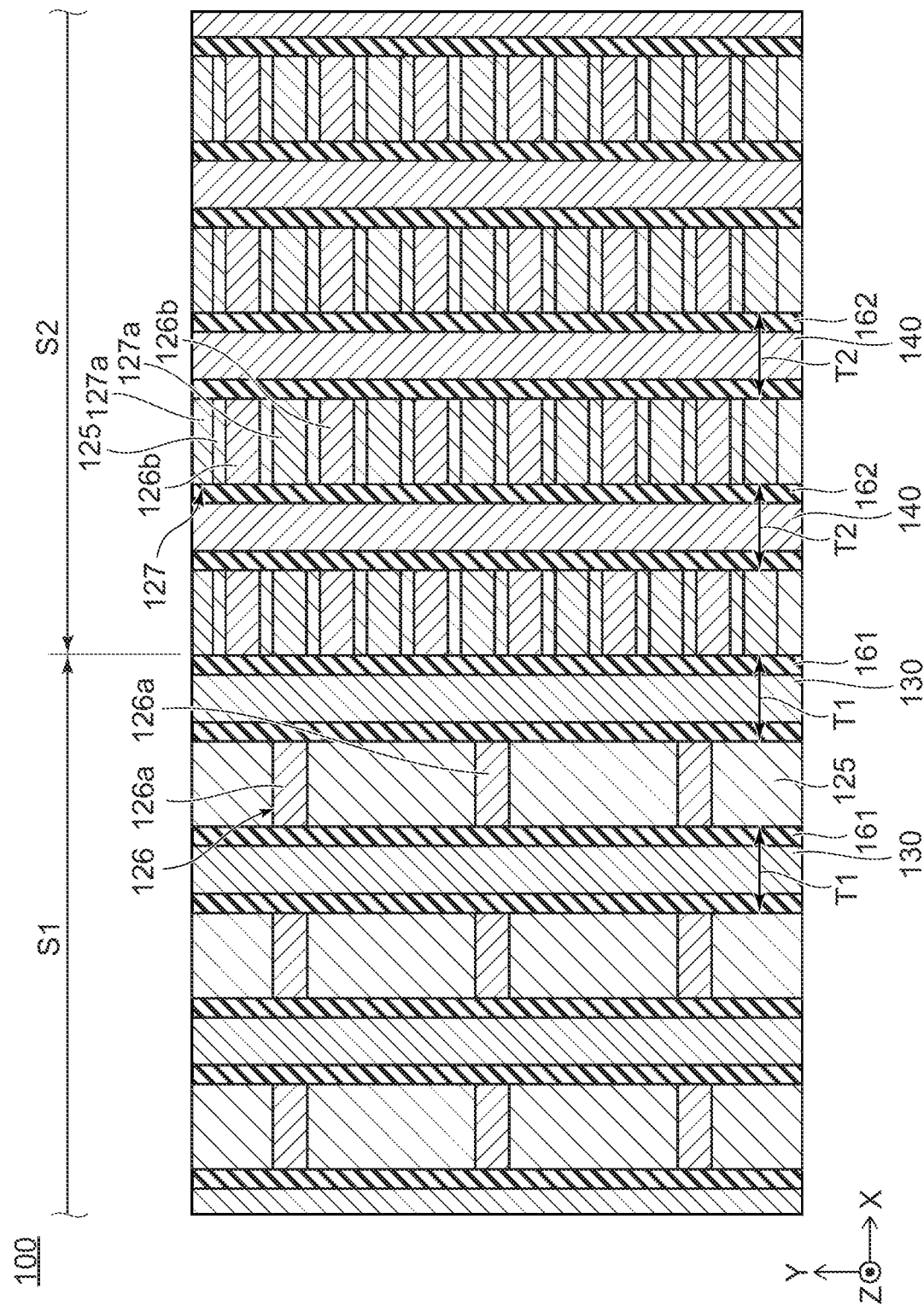
FIG. 3 is a cross-sectional view along line B-B' of FIG. 2.

FIG. 3 is a cross-sectional view along line B-B' of FIG. 2.

The semiconductor device 100 according to the embodiment is an RC-IGBT. As shown in FIG. 1, a diode region S1 and an IGBT region S2 are set in the semiconductor device 100. For example, multiple diode regions S1 and multiple IGBT regions S2 are set in the semiconductor device 100; and the multiple diode regions S1 and the multiple IGBT regions S2 are alternately arranged in the X-direction.

According to the embodiment as shown in FIG. 2, the semiconductor device 100 includes a lower electrode 110, a UC (Universal Contact) layer 121, a p$^+$-type collector layer 122, an n-type cathode layer 123, an n-type semiconductor layer 124, a p-type semiconductor layer 125, a p$^+$-type contact layer 126, an n$^+$-type emitter layer 127, multiple internal electrodes 130, multiple gate electrodes 140, an upper electrode 150, multiple insulating films 161, and multiple insulating films 162. The components of the semiconductor device 100 will now be elaborated. The side on which the lower electrode 110 is disposed is defined as "lower side", and the side on which the upper electrode 150 is disposed is defined as "upper side".

The lower electrode 110 is made of a conductive material such as a metal material, etc. The lower electrode 110 is located in substantially the entire region of the lower surface of the semiconductor device 100. In other words, the lower electrode 110 is located from the diode region S1 to the IGBT region S2. The lower electrode 110 functions as a cathode electrode in the diode region S1 and functions as a collector electrode in the IGBT region S2. The upper surface and the lower surface of the lower electrode 110 are substantially parallel to the XY plane.

According to the embodiment, the UC layer 121 is located on the portion of the lower electrode 110 positioned in the diode region S1, and has an ohmic contact with the lower electrode 110. The UC layer 121 includes multiple n$^+$-type semiconductor portions 121a (first semiconductor regions) and multiple p$^+$-type semiconductor portions 121b (second semiconductor regions). For example, the multiple n$^+$-type semiconductor portions 121a and the multiple p$^+$-type semiconductor portions 121b are alternately arranged in the X-direction. The n$^+$-type semiconductor portions 121a and the p$^+$-type semiconductor portions 121b extend in the Y-direction. However, the multiple n$^+$-type semiconductor portions and the multiple p$^+$-type semiconductor portions may be alternately arranged in a direction that is not along the upper surface of the lower electrode 110.

The dimensions in the X-direction, i.e., the widths, of the n$^+$-type semiconductor portions 121a may be a constant or may be different from each other. Similarly, the widths of the p$^+$-type semiconductor portions 121b may be a constant or may be different from each other. A pitch P of the multiple n$^+$-type semiconductor portions 121a and the multiple p$^+$-type semiconductor portions 121b that are alternately arranged may be a constant or may be different from each other. Here, the "pitch P" means the distance between the X-direction center of one n$^+$-type semiconductor portion 121a and the X-direction center of the p$^+$-type semiconductor portion 121b next to the one n$^+$-type semiconductor portion 121a. It is favorable for the pitch P to be, for example, greater than 0 μm and not more than 50 μm.

At least one p$^+$-type semiconductor portion 121b1 among the multiple p$^+$-type semiconductor portions 121b protrudes higher than the adjacent n$^+$-type semiconductor portion 121a. The width of the p$^+$-type semiconductor portion 121b1 is greater than the width of the adjacent n$^+$-type semiconductor portion 121a. However, the width of the p$^+$-type semiconductor portion 121b1 may be not more than the width of the adjacent n$^+$-type semiconductor portion 121a. Also, such a p$^+$-type semiconductor portion 121b1 may not be included in the semiconductor device 100.

According to the embodiment, the p$^+$-type collector layer 122 is located on the portion of the lower electrode 110 positioned in the IGBT region S2, and contacts the lower electrode 110. The p$^+$-type collector layer 122 is next to the UC layer 121 in the X-direction. However, a portion of the UC layer may be positioned in the IGBT region; and a portion of the p$^+$-type collector layer may be positioned in the diode region.

The n-type cathode layer 123 is located on the UC layer 121 in the diode region S1. According to the embodiment, the n-type cathode layer 123 is not located in the IGBT region S2. However, an n-type cathode layer may be located in the IGBT region. The dimension in the Z-direction, i.e., a thickness D2, of the n-type cathode layer 123 is greater than a thickness D1 of the n$^+$-type semiconductor portion 121a of the UC layer 121. The impurity concentration distribution of the UC layer 121 and the n-type cathode layer 123 is described below.

The n-type semiconductor layer 124 is located from the diode region S1 to the IGBT region S2. According to the embodiment, the n-type semiconductor layer 124 is located on the n-type cathode layer 123 in the diode region S1 and located on the p$^+$-type collector layer 122 in the IGBT region. When an n-type cathode layer also is located in the IGBT region, an n-type semiconductor layer is located on the n-type cathode layer in the IGBT region as well. The n-type semiconductor layer is positioned higher than the p$^+$-type collector layer in the IGBT region when an n-type cathode layer also is located in the IGBT region and when an n-type cathode layer is not located in the IGBT region.

The n-type semiconductor layer 124 includes an n-type buffer region 124a and an n$^-$-type drift region 124b.

The n-type buffer region 124a is located from the diode region S1 to the IGBT region S2. The n-type buffer region 124a is located on the n-type cathode layer 123 in the diode region S1 and located on the p$^+$-type collector layer 122 in the IGBT region S2. The impurity concentration of the n-type buffer region 124a is less than the impurity concentration of the n-type cathode layer 123. However, an n-type buffer region may not be included in the semiconductor device.

The n$^-$-type drift region 124b is located on the n-type buffer region 124a in the diode region S1 and the IGBT region S2. The impurity concentration of the n$^-$-type drift region 124b is less than the impurity concentration of the n-type buffer region 124a.

The p-type semiconductor layer 125 is located in the diode region S1 and the IGBT region S2. The p-type semiconductor layer 125 is located on the n$^-$-type drift region 124b. The p-type semiconductor layer 125 functions as a p-type anode layer in the diode region S1 and functions as a p-type base layer in the IGBT region S2.

It is favorable for the impurity amount per unit area of the p-type semiconductor layer 125 to be not less than $1 \times 10^{12}$ cm$^{-2}$ and $5 \times 10^{12}$ cm$^{-2}$. The impurity amount per unit area of the p-type semiconductor layer 125 is, for example, substantially the same amount as the dose of ions when ion-implanting to form the p-type semiconductor layer 125. However, the impurity amount per unit area of the p-type semiconductor layer 125 is not limited to that described above.

Multiple trenches T1 are provided in the diode region S1 of the semiconductor device 100. As shown in FIGS. 2 and 3, the trenches T1 extend downward from the upper surface of the p-type semiconductor layer 125. The lower end of each trench T1 is positioned lower than the upper surface of the n$^-$-type drift region 124b and higher than the upper surface of the n-type buffer region 124a, and more specifically, in the upper layer portion of the n$^-$-type drift region 124b. As shown in FIG. 3, the multiple trenches T1 are arranged in the X-direction. The trenches T1 extend in the Y-direction.

Similarly, as shown in FIG. 2, multiple trenches T2 are provided in the IGBT region S2 of the semiconductor device 100. As shown in FIGS. 2 and 3, the trenches T2 extend downward from the upper surface of the p-type semiconductor layer 125. The lower end of each trench T2 is positioned lower than the upper surface of the n$^-$-type drift region 124b and higher than the upper surface of the n-type buffer region 124a, and more specifically, in the upper layer portion of the n$^-$-type drift region 124b. As shown in FIG. 3, the multiple trenches T2 are arranged in the X-direction. The trenches T2 extend in the Y-direction.

The p$^+$-type contact layer 126 is partially provided in the upper layer portion of the p-type semiconductor layer 125 in the diode region S1 and the IGBT region S2. Specifically, as shown in FIG. 3, the p$^+$-type contact layer 126 includes multiple extension portions 126a that extend in the X-direction and are positioned between two trenches T1 that are next to each other in the diode region S1, and multiple extension portions 126b that extend in the X-direction and are positioned between two trenches T2 that are next to each other in the IGBT region S2. The multiple extension portions 126a are arranged in the Y-direction. Similarly, the multiple extension portions 126b are arranged in the Y-direction. The distance between the two extension portions 126a that are next to each other in the Y-direction is greater than the distance between the two extension portions 126b that are next to each other in the Y-direction. However, the location of the p$^+$-type contact layer is not limited to that described above.

The n$^+$-type emitter layer 127 is partially provided in the upper layer portion of the p-type semiconductor layer 125 in the IGBT region S2, and is not provided in the diode region S1. Specifically, the n$^+$-type emitter layer 127 includes multiple extension portions 127a that extend in the X-direction and are positioned between two trenches T2 that are next to each other in the IGBT region S2. Each extension portion 127a is located between two extension portions 126b that are next to each other with the p-type semiconductor layers 125 interposed. However, the arrangement of the n$^+$-type emitter layers is not limited to that described above.

The UC layer 121, the p$^+$-type collector layer 122, the n-type cathode layer 123, the n-type semiconductor layer 124, the p-type semiconductor layer 125, the p$^+$-type contact layer 126, and the n$^+$-type emitter layer 127 include, for example, a material such as silicon or the like, and impurities that correspond to the conductivity types of the layers.

As shown in FIG. 2, the internal electrode 130 is located in trenches T1 of the diode region S1. The internal electrodes 130 are made of a conductive material such as a metal material, polysilicon, etc. As shown in FIG. 2, the internal electrodes 130 extend from the upper surface of the p$^+$-type contact layer 126 toward the n$^-$-type drift region 124b. The lower end of each internal electrode 130 is positioned in the upper layer portion of the n$^-$-type drift region 124b. As shown in FIG. 3, the internal electrodes 130 extend in the Y-direction. Each internal electrode 130 is next to the p$^+$-type contact layer 126, the p-type semiconductor layer 125, and the n$^-$-type drift region 124b in the X-direction with the insulating film 161 that is described below interposed.

As shown in FIG. 2, the gate electrode 140 is located in trenches T2 of the IGBT region S2. The gate electrodes 140 are made of a conductive material such as a metal material, polysilicon, etc. The gate electrodes 140 extend from the upper surface of the n$^+$-type emitter layer 127 toward the n$^-$-type drift region 124b. The lower end of each gate electrode 140 is positioned in the upper layer portion of the n$^-$-type drift region 124b. As shown in FIG. 3, the gate electrodes 140 extend in the Y-direction. Each gate electrode 140 is next to the n$^+$-type emitter layer 127, the p$^+$-type contact layer 126, the p-type semiconductor layer 125, and the n$^-$-type drift region 124b in the X-direction with the insulating film 162 that is described below interposed.

The upper electrode 150 is made of a conductive material such as a metal material, etc. The upper electrode 150 is located from the diode region S1 to the IGBT region S2. The upper electrode 150 is located on the p-type semiconductor layer 125, the p$^+$-type contact layer 126, and the n$^+$-type emitter layer 127 and is connected to these layers. The upper electrode 150 functions as an anode electrode in the diode region S1 and functions as an emitter electrode in the IGBT region S2. For example, the upper electrode 150 is electrically connected to the internal electrodes 130. The upper electrode 150 is electrically insulated from the gate electrode 140.

The insulating films 161 are located between the upper electrode 150 and the internal electrodes 130, between the p-type semiconductor layer 125 and the internal electrodes 130, between the $p^+$-type contact layer 126 and the internal electrodes 130, and between the n-type semiconductor layer 124 and the internal electrodes 130.

The insulating films 162 are located between the upper electrode 150 and the gate electrodes 140, between the $n^+$-type emitter layer 127 and the gate electrodes 140, between the $p^+$-type contact layer 126 and the gate electrodes 140, between the p-type semiconductor layer 125 and the gate electrodes 140, and between the n-type semiconductor layer 124 and the gate electrodes 140.

The insulating films 161 and 162 are made of insulating materials such as silicon oxide, silicon nitride, etc.

The impurity concentration distribution of the UC layer 121 and the n-type cathode layer 123 will now be described.

Figure 4:
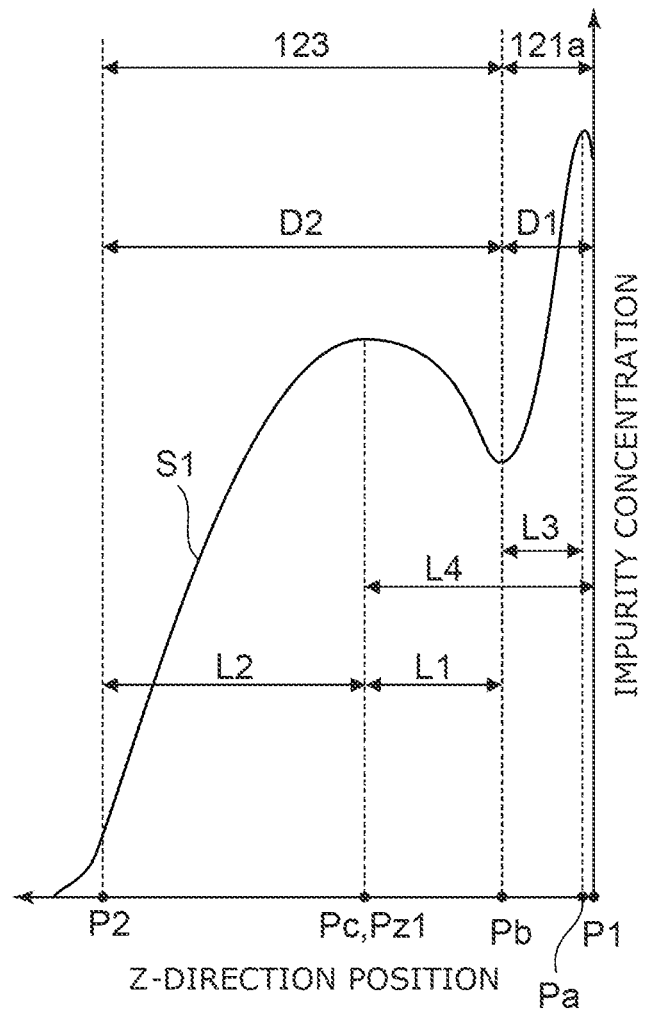
FIG. 4 is a graph showing one example of an impurity concentration distribution between a point P1 and a point P2 of FIG. 2.

FIG. 4 is a graph showing one example of an impurity concentration distribution between a point P1 and a point P2 of FIG. 2.

Figure 5:
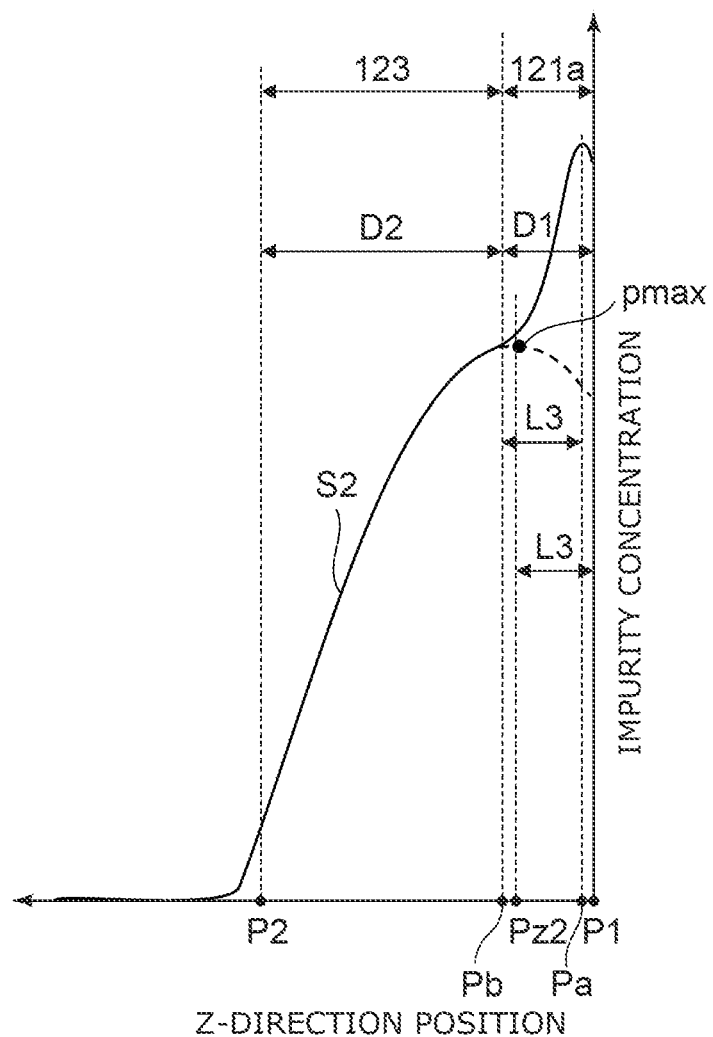
FIG. 5 is a graph showing another example of an impurity concentration distribution between the point P1 and the point P2 of FIG. 2.

FIG. 5 is a graph showing another example of an impurity concentration distribution between the point P1 and the point P2 of FIG. 2.

In FIGS. 4 and 5, the horizontal axis is the Z-direction position. In FIGS. 4 and 5, the vertical axis is the impurity concentration.

For example, as shown in FIG. 4, the impurity concentration of the semiconductor device 100 gradually increases upward from the start point of the point P1 on the upper surface of the lower electrode 110, and has a first maximum at a point Pa. The impurity concentration gradually decreases upward from the point Pa and has a minimum at a point Pb. The portion of the impurity concentration between the point P1 on the upper surface of the lower electrode 110 and the point Pb at which the impurity concentration has the first minimum corresponds to the n-type semiconductor portion 121a of the UC layer 121. The point Pb also is an inflexion point at which the absolute value of the slope of the tangent of a curve S1 of the impurity concentration is a minimum. The distance between the point P1 and the point Pb corresponds to the thickness D1 of the n-type semiconductor portion 121a. The distance between the point P1 and the point Pa is sufficiently less than the distance between the point Pa and the point Pb.

The impurity concentration gradually increases upward from the point Pb and again has a maximum at a point Pc. The impurity concentration gradually decreases upward from the point Pc and is 1/10 of the impurity concentration of the point Pc at the point P2. In the semiconductor device 100, the portion between the point Pb and the point P2 corresponds to the n-type cathode layer 123. Accordingly, the point Pb is a point at the lower end of the n-type cathode layer 123; the point P2 is a point at the upper end of the n-type cathode layer 123; and the distance between the point Pb and the point P2 corresponds to the thickness D2 of the n-type cathode layer 123. The point Pc corresponds to an intermediate point between the upper end and the lower end of the n-type cathode layer 123.

A distance L1 between the point Pb and the point Pc is less than a distance L2 between the point Pc and the point P2. Thereby, the point Pc at which the impurity concentration of the n-type cathode layer 123 is a maximum can approach the UC layer 121.

The impurity concentration at the point Pc is less than the impurity concentration at the point Pa. In other words, the maximum value of the impurity concentration of the n-type cathode layer 123 is less than the maximum value of the impurity concentration of the n-type semiconductor portion 121a of the UC layer 121.

For example, as shown in FIG. 5, the impurity concentration of the semiconductor device 100 may not switch to an increase from the point Pb. Specifically, the impurity concentration gradually decreases from the point Pb toward the point P2. The impurity concentration also gradually decreases from the point Pa toward the point Pb; and the decrease rate gradually decreases toward the point Pb. The decrease rate again increases from the point Pb toward the point P2. Accordingly, the absolute value of the slope of the tangent of a curve S2 of the impurity concentrations of the $n^+$-type semiconductor portion 121a and the n-type cathode layer 123 has a minimum at the point Pb. In other words, the point Pb corresponds to the inflexion point. The impurity concentration at the point P2 is 1/10 of the impurity concentration of the point Pb. In such a case as well, the portion between the point Pb and the point P2 that is a minimum corresponds to the n-type cathode layer 123. Accordingly, the point Pb is a point at the lower end of the n-type cathode layer 123; the point P2 is a point at the upper end of the n-type cathode layer 123; and the distance between the point Pb and the point P2 corresponds to the thickness D2 of the n-type cathode layer 123. In such a case, the distance between the lower end of the n-type cathode layer 123 and the point Pb at which the impurity concentration of the n-type cathode layer 123 has a maximum is 0 (zero), and is less than the distance between the upper end of the n-type cathode layer 123 and the point Pb at which the impurity concentration of the n-type cathode layer 123 has a maximum. In such a case as well, the point Pb at which the impurity concentration of the n-type cathode layer 123 has a maximum can approach the UC layer 121.

The n-type cathode layer 123 that has the impurity concentration distribution shown in FIG. 4 or FIG. 5 can be formed by, for example, adjusting the Z-direction position of the peak of an ion distribution when ion-implanting. The ion distribution of the ion implantation for forming the n-type cathode layer 123 is shown by a broken line in FIG. 5. When forming the n-type cathode layer 123 that has an impurity concentration distribution such as that of FIG. 5, a peak pmax of the ion distribution may overlap the upper layer portion of the UC layer 121.

As described below, it is favorable for the Z-direction position of the peak pmax to be the same as or higher than a position that is distant to the upper surface of the lower electrode 110 by a length that is 0.5 times the diffusion width of the ions when ion-implanting to form the n-type semiconductor portion 121a. Thereby, the n-type cathode layer 123 appears at the vicinity of the peak pmax. The length that is 0.5 times the diffusion width of the ions is substantially equal to a distance L3 between the point Pb at the lower end of the n-type cathode layer 123 and the point Pa at which the impurity concentration of the n-type semiconductor portion 121a has a maximum. Accordingly, it is favorable for the Z-direction position of the peak pmax to be the same as a position Pz2 that is the distance L3 away from the upper surface of the lower electrode 110 or higher than the position Pz2.

In the semiconductor device 100 of the impurity concentration distribution shown in FIG. 4, it is favorable for the Z-direction position of the peak pmax of the ion distribution when ion-implanting to form the n-type cathode layer 123 to be the same as or higher than a position that is distant to the upper surface of the lower electrode 110 by a length that is 1.5 times the diffusion width of the ions when ion-implanting to form the n-type semiconductor portion 121a. The separation of the peak pmax from the UC layer 121 can be suppressed thereby. In such a case, the Z-direction position of the peak pmax of the ion distribution is substantially the same as the position of the point Pc at which the impurity concentration of the n-type cathode layer 123 has a maximum. Accordingly, it is favorable for the position of the point Pc to be the same as a position Pz1 that is distant to the upper surface of the lower electrode 110 by a length L4 that is 3 times the distance L3 or lower than the position Pz1.

Effects of the embodiment will now be described.

When the n$^+$-type cathode layer through which only electrons can move is provided on the lower electrode 110 of the diode region S1 instead of the UC layer 121, only electrons are injected from the n$^+$-type cathode layer into the n-type semiconductor layer 124 when a return current flows in the diode region S1. Therefore, the concentration of the electrons at the vicinity of the lower electrode 110 increases. As a result, when switching to the off-state from the on-state in which the return current flows through the diode region S1, it takes time for the electrons to be ejected to the lower electrode 110; and the switching loss increases. Conversely, in the semiconductor device 100 according to the embodiment, the UC layer 121 that is connected to the lower electrode 110 is provided in the diode region S1. Not only electrons but also holes can move in the UC layer 121. Therefore, in the state in which the return current flows in the diode region S1, the injection amount of the holes into the UC layer 121 can be increased commensurately with the reduction of the injection amount of the electrons from the UC layer 121 into the n-type semiconductor layer 124. The concentration of the electrons at the vicinity of the lower electrode 110 can be reduced thereby. As a result, the electrons can be rapidly ejected to the lower electrode 110 when switching the diode region from the on-state to the off-state. The switching loss can be reduced thereby.

In the semiconductor device 100 according to the embodiment, the n-type cathode layer 123 is located on the UC layer 121. The distance L1 between the lower end of the n-type cathode layer 123 and the point Pc that is the position at which the impurity concentration of the n-type cathode layer 123 has a maximum is less than the distance L2 between the upper end of the n-type cathode layer 123 and the point Pc that is the position at which the impurity concentration has a maximum. Thereby, the position at which the impurity concentration of the n-type cathode layer 123 has a maximum can approach the UC layer 121. This configuration functions to couple the n-type cathode layer 123 and the UC layer 121; and the injection amount of the electrons into the n-type semiconductor layer 124 from the UC layer 121 and the n-type cathode layer 123 can be favorably controlled. The forward voltage of the semiconductor device 100 can be controlled thereby.

At least one p$^+$-type semiconductor portion 121b1 among the multiple p$^+$-type semiconductor portions 121b protrudes further than the n-type semiconductor portion 121a in the Z-direction. Therefore, holes are easily injected from the p$^+$-type semiconductor portion 121b1 into the n-type semiconductor layer 124 when switching the diode region S1 from the on-state to the off-state. The abrupt disappearance of carriers in the n-type semiconductor layer 124 can be suppressed thereby. As a result, the oscillation of a tail current can be reduced when switching the tail current from the on-state to the off-state.

EXAMPLE

An example will now be described.

Figure 6:
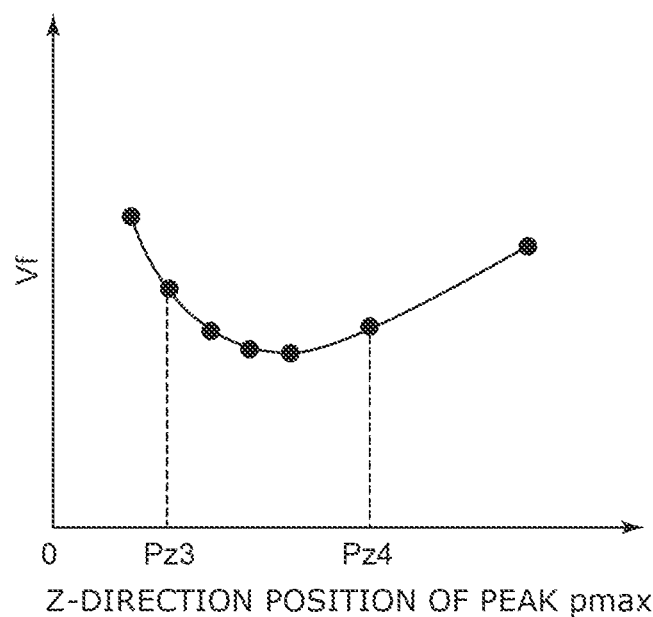
FIG. 6 is a graph showing simulation results of a relationship between a forward voltage Vf and the Z-direction position of a peak pmax of an ion implantation distribution when ion-implanting to form a n-type cathode layer.

FIG. 6 is a graph showing simulation results of a relationship between a forward voltage Vf and the Z-direction position of the peak pmax of the ion implantation distribution when ion-implanting to form the n-type cathode layer.

The horizontal axis of FIG. 6 is the Z-direction position of the peak pmax of the ion distribution when ion-implanting to form the n-type cathode layer 123, in which the upper surface of the lower electrode 110 is set to 0. The vertical axis of FIG. 6 is the forward voltage Vf.

The forward voltage Vf at each position of the peak pmax was simulated for the semiconductor device 100 by changing the Z-direction position of the peak pmax of the ion distribution when ion-implanting to form the n-type cathode layer 123. The results are shown in FIG. 6.

The forward voltage Vf gradually decreased as the position of the peak pmax separated from the upper surface of the lower electrode 110. Then, the forward voltage Vf began increasing as the position of the peak pmax continued to separate from the upper surface of the lower electrode 110.

In FIG. 6, the position that is distant to the lower electrode 110 by a length that is 0.5 times the diffusion width of the ions when ion-implanting to form the n-type semiconductor portion 121a is substantially a depth of 0.25 μm, and is shown by a reference numeral Pz3. The position that is distant to the lower electrode 110 by a length that is 1.5 times the diffusion width is substantially a depth of 0.75 μm, and is shown by a reference numeral Pz4. The forward voltage Vf has substantially a minimum in a range in which the position of the peak pmax is not less than the position Pz3 and not more than the position Pz4. Accordingly, it is favorable for the position of the peak pmax to be not less than the position Pz3 and not more than the position Pz4.

As described above, the length of 0.5 times the diffusion width is substantially equal to the distance L3 between the point Pb at the lower end of the n-type cathode layer 123 and the point Pa at which the impurity concentration of the n-type semiconductor portion 121a has a maximum. Accordingly, the position Pz3 is substantially equal to the position Pz2 of FIG. 5; and the position Pz4 is substantially equal to the position Pz1 of FIG. 4. In the n-type cathode layer 123 that has an impurity concentration distribution such as that of FIG. 4, the point Pc at which the impurity concentration has a maximum is substantially equal to the position of the peak pmax. Accordingly, it is favorable for the position of the point Pc to be the same as the position Pz1 that is distant to the upper surface of the lower electrode 110 by the length L4 that is 3 times the distance L3, or is lower than the position Pz1.

Figure 7:
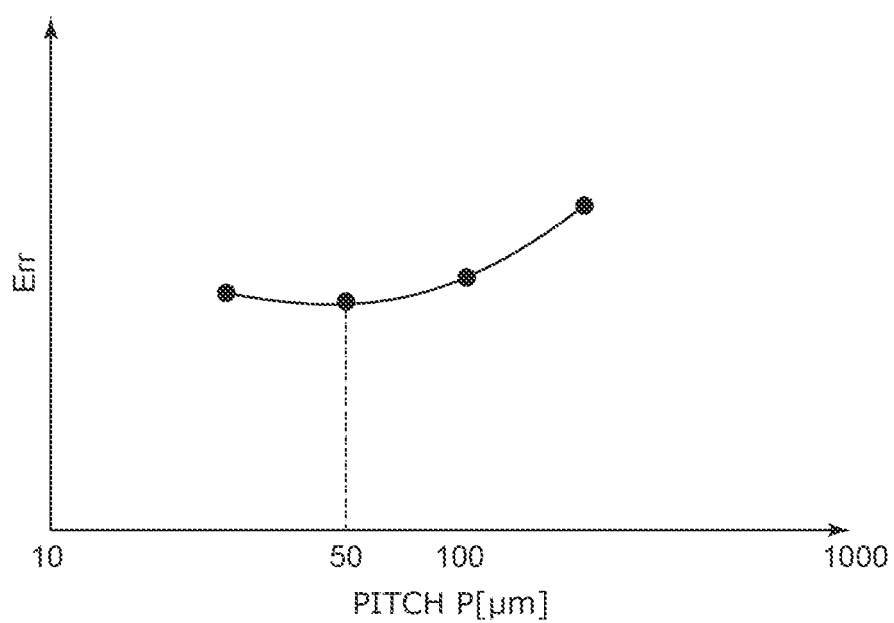
FIG. 7 is a graph showing simulation results of a relationship between a switching loss Err and a pitch P of an UC layer.

FIG. 7 is a graph showing simulation results of a relationship between a switching loss Err and the pitch P of the UC layer.

The horizontal axis of FIG. 7 is the pitch P of the n$^+$-type semiconductor portion 121a and the p$^+$-type semiconductor portion 121b of the UC layer 121. The vertical axis of FIG. 7 is the switching loss Err when switching the diode region S1 from the on-state to the off-state.

Switching loss Err at each pitch P was simulated for the semiconductor device 100 by changing the pitch P. The results are shown in FIG. 7.

The switching loss Err gradually decreased as the pitch P gradually decreased. Then, the switching loss Err became substantially constant when the pitch P was not more than 50 µm. Accordingly, it is favorable for the pitch P to be greater than 0 and not more than 50 µm. 50 µm substantially matches a length that is ⅓ of the carrier diffusion length. Here, the carrier diffusion length means the distance that carriers such as electrons and holes flow without extinction due to recombination.

Figure 8A:
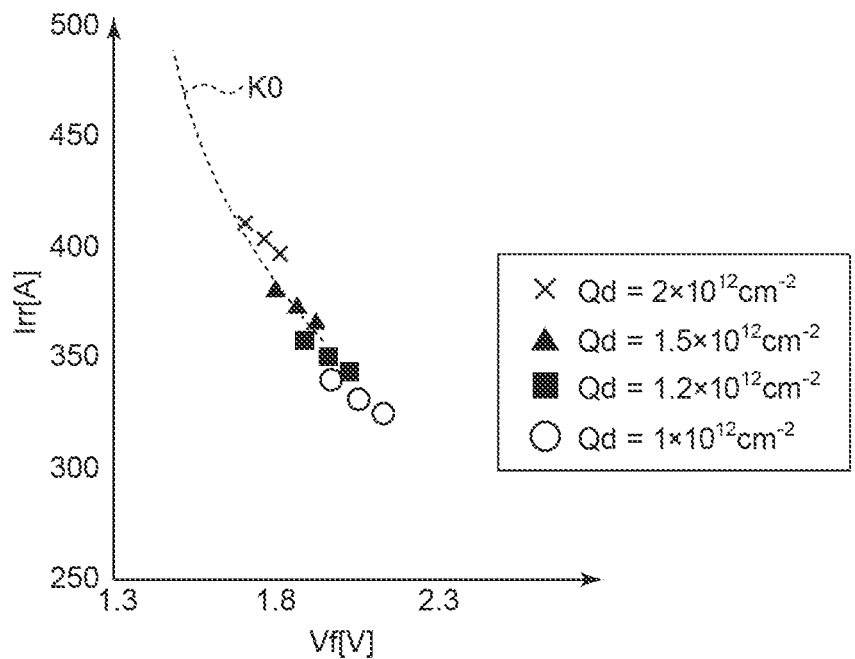
FIG. 8A is a graph that shows simulation results of a relationship between the forward voltage Vf and a reverse recovery current Irr when changing a dose Qd when ion-implanting to form a p-type semiconductor layer, and shows a favorable relationship between the forward voltage Vf and the reverse recovery current Irr.
Figure 8B:
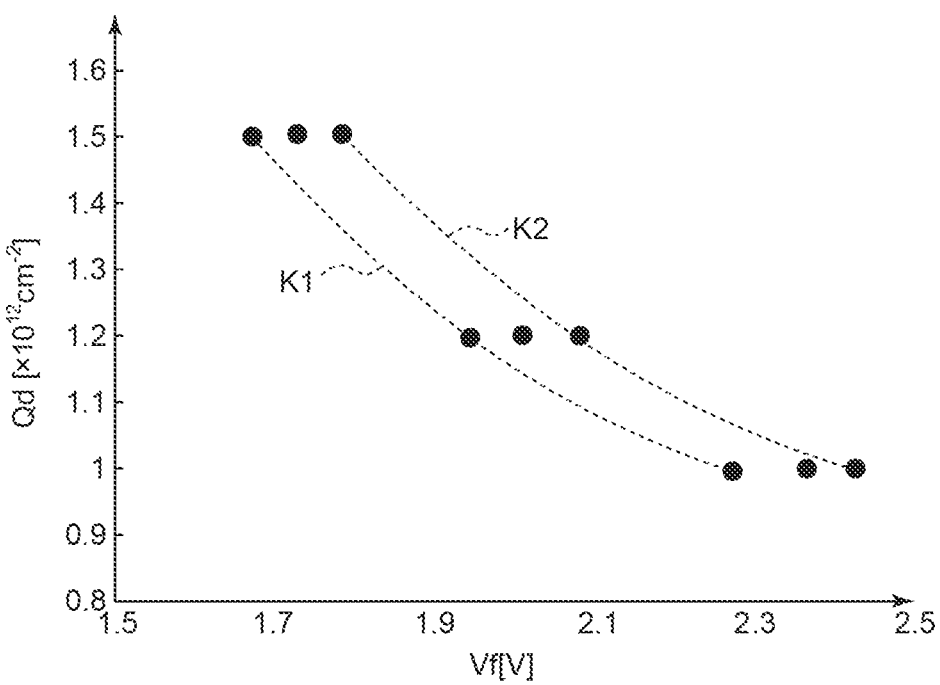
FIG. 8B is a graph showing the range of the dose Qd to obtain the forward voltage Vf at a vicinity of the favorable forward voltage Vf of FIG. 8A.

FIG. 8A is a graph that shows simulation results of a relationship between the forward voltage Vf and a reverse recovery current Irr when changing a dose Qd when ion-implanting to form the p-type semiconductor layer, and shows a favorable relationship between the forward voltage Vf and the reverse recovery current Irr; and FIG. 8B is a graph showing the range of the dose Qd to obtain the forward voltage Vf at the vicinity of the favorable forward voltage Vf of FIG. 8A.

The horizontal axis of FIG. 8A is the forward voltage Vf. The vertical axis of FIG. 8A is the reverse recovery current Irr. The horizontal axis of FIG. 8B is the forward voltage Vf. The vertical axis of FIG. 8B is the dose Qd when ion-implanting to form the p-type semiconductor layer 125.

The forward voltage Vf and the reverse recovery current Irr at each dose Qd were simulated for the semiconductor device 100 by changing the dose Qd. The results are shown in FIG. 8A. FIG. 8A also shows the relationship between the reverse recovery current Irr and the favorable forward voltage Vf as a broken line K0.

As shown in FIG. 8A, it was found that a relationship between the forward voltage Vf and the reverse recovery current Irr that is near the broken line K0 is obtained in a range in which the dose Qd is not less than $1 \times 10^{12}$ cm$^{-2}$. Accordingly, it is favorable for the dose Qd to be not less than $1 \times 10^{12}$ cm$^{-2}$. The impurity amount per unit area of the p-type semiconductor layer 125 is, for example, substantially the same as the dose Qd. Accordingly, it is favorable for the impurity amount per unit area of the p-type semiconductor layer 125 to be not less than $1 \times 10^{12}$ cm$^{-2}$.

The dose Qd was investigated to obtain the forward voltage Vf at the vicinity of the forward voltage Vf shown by the broken line K0. As a result, it was found that the dose Qd that obtains the forward voltage Vf at the vicinity of the forward voltage Vf shown by the broken line K0 is in a range between a broken line K1 and a broken line K2 of FIG. 813.

The relationship between the forward voltage Vf and the doses Qd along the broken line K1 of FIG. 813 is represented by the following Formula (1), in which the units of the dose Qd are cm$^{-2}$, and the units of Vf are V.

$$Qd/10^{12}=0.84 \times Vf^2-4.15 \times Vf+6.10 \qquad \text{Formula (1)}$$

The relationship between the forward voltage Vf and the doses Qd along the broken line K2 of FIG. 8B is represented by the following Formula (2), in which the units of the dose Qd are cm$^{-2}$, and the units of the forward voltage Vf are V.

$$Qd/10^{12}=0.68 \times Vf^2-3.65 \times Vf+5.85 \qquad \text{Formula (2)}$$

Accordingly, it is favorable for the dose Qd/$10^{12}$ to be not less than $0.84 \times$ forward voltage Vf$^2-4.15 \times$ forward voltage Vf+6.10 and not more than $0.68 \times$ forward voltage Vf$^2-3.65 \times$ forward voltage Vf+5.85, in which the units of the dose Qd are cm$^{-2}$, and the units of the forward voltage Vf are V. The impurity amount per unit area of the p-type semiconductor layer 125 is, for example, substantially the same as the dose Qd. Accordingly, it is favorable for the impurity amount/$10^{12}$ per unit area of the p-type semiconductor layer 125 to be not less than $0.84 \times$ forward voltage Vf$^2-4.15 \times$ forward voltage Vf+6.10 and not more than $0.68 \times$ forward voltage Vf$^2-3.65 \times$ forward voltage Vf+5.85, in which the units of the impurity amount per unit area of the p-type semiconductor layer 125 are cm$^{-2}$, and the units of the forward voltage Vf are V.

Second Embodiment

A second embodiment will now be described.

Figure 9:
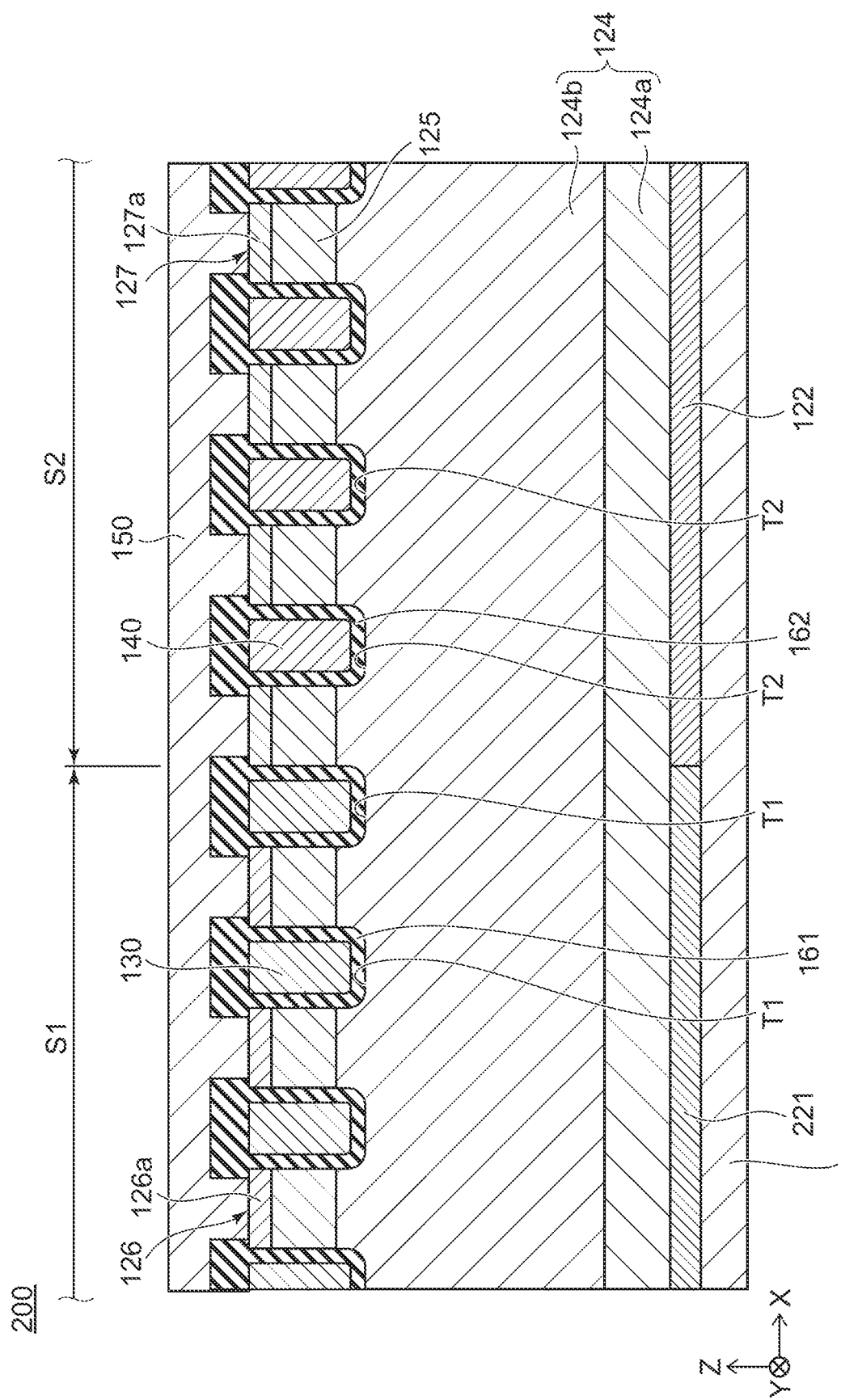
FIG. 9 is a cross-sectional view showing a semiconductor device according to a second embodiment.

FIG. 9 is a cross-sectional view showing a semiconductor device according to the embodiment.

The semiconductor device 200 according to the embodiment differs from the semiconductor device 100 according to the first embodiment in that a transparent n$^+$-type cathode layer 221 is included instead of the UC layer 121 and the n-type cathode layer 123.

As a general rule in the following description, only the differences with the first embodiment are described. Other than the items described below, the embodiment is similar to the first embodiment. This is similar for the other embodiments described below as well.

The n$^+$-type cathode layer 221 is located on the lower electrode 110 and under the n-type buffer region 124a in the diode region S1.

In a conventional n$^+$-type cathode layer, electrons can move, but holes cannot move. Conversely, according to the embodiment, the injection efficiency of the electrons from the n$^+$-type cathode layer 221 into the n-type semiconductor layer 124 is reduced, and the holes are commensurately injected from the n-type semiconductor layer 124 into the n$^+$-type cathode layer 221. Thus, the phrase "the n$^+$-type cathode layer 221 is transparent" is used when not only electrons but also holes can move through the n$^+$-type cathode layer 221.

Although not particularly limited, the method of making the n$^+$-type cathode layer 221 transparent includes examples such as a method of reducing the thickness of the n$^+$-type cathode layer 221, a method of reducing the impurity concentration of the n$^+$-type cathode layer 221, etc. The thickness to make the n$^+$-type cathode layer 221 transparent is, for example, greater than 0 µm and not more than 0.1 µm. The impurity concentration to make the n$^+$-type cathode layer 221 transparent is, for example, not less than $1 \times 10^{19}$ cm$^{-2}$ and not more than $1 \times 10^{20}$ cm$^{-2}$.

For example, the n$^+$-type cathode layer 221 may be entirely transparent or partially transparent. Also, for example, the injection efficiency of the electrons of the n$^+$-type cathode layer 221 in a first region of the diode region S1 that is adjacent to the IGBT region S2 may be greater than the injection efficiency of the electrons in a second region of the diode region S1 that is separated from the IGBT region S2. For example, such a configuration can be realized by setting the impurity concentration of the first region to be greater than the impurity concentration of the second region or by setting the thickness of the first region to be greater than the thickness of the second region. In such a case, the injection efficiency of the electrons may gradually decrease or may decrease in stages from the boundary between the diode region S1 and the IGBT region S2 toward the X-direction center of the diode region S1.

Similarly, the p$^+$-type collector layer 122 also is transparent. In other words, the injection efficiency of the holes from the p$^+$-type collector layer 122 into the n-type semiconductor layer 124 on the p$^+$-type collector layer 122 is reduced, and the holes are commensurately injected from the n-type semiconductor layer 124 into the p$^+$-type collector layer 122.

Although not particularly limited, the method of making the p$^+$-type collector layer 122 transparent includes examples such as a method of reducing the thickness of the p$^+$-type collector layer 122, a method of reducing the impurity concentration of the p$^+$-type collector layer 122, etc. The thickness to make the p$^+$-type collector layer 122 transparent is, for example, greater than 0 μm and not more than 0.2 μm. The impurity concentration to make the p$^+$-type collector layer 122 transparent is, for example, not less than $1\times10^{18}$ cm$^{-2}$ and not more than $1\times10^{19}$ cm$^{-2}$.

For example, the p$^+$-type collector layer 122 may be entirely transparent or partially transparent.

Effects of the semiconductor device 200 according to the embodiment will now be described.

According to the embodiment, at least a portion of the n$^+$-type cathode layer 221 is transparent. Therefore, the injection efficiency of the electrons from the n$^+$-type cathode layer 221 into the n-type semiconductor layer 124 can be reduced. Thereby, the concentration of the electrons at the vicinity of the lower electrode 110 can be reduced when the diode region S1 is in the on-state. As a result, the electrons can be rapidly ejected to the lower electrode 110 when switching the diode region from the on-state to the off-state. The switching loss of the diode region S1 of the semiconductor device 200 can be reduced thereby.

The injection efficiency of the electrons of the n$^+$-type cathode layer 221 in the first region of the diode region S1 that is adjacent to the IGBT region S2 may be greater than the injection efficiency of the electrons in the second region of the diode region S1 that is separated from the IGBT region S2. In such a case, the decrease of the carrier concentration of the first region adjacent to the IGBT region S2 can be suppressed while reducing the switching loss of the diode region S1 of the semiconductor device 200. Snapback can be suppressed by suppressing the decrease of the carrier concentration of the first region adjacent to the IGBT region S2.

Embodiments may include the following configurations (e.g., technological proposals).

Configuration 1

A semiconductor device in which a diode region and an IGBT region are set,
the device comprising:
  a first electrode located in the diode region and the IGBT region;
  a first semiconductor layer located on the first electrode in the diode region, the first semiconductor layer including a plurality of first semiconductor portions and a plurality of second semiconductor portions alternately arranged in a first direction along an upper surface of the first electrode, the plurality of first semiconductor portions being of a first conductivity type, the plurality of second semiconductor portions being of a second conductivity type;
  a second semiconductor layer located on the first electrode in the IGBT region, the second semiconductor layer being of the second conductivity type;
  a third semiconductor layer located on the first semiconductor layer in the diode region, the third semiconductor layer being of the first conductivity type, an impurity concentration of the third semiconductor layer having a maximum at a first position in a second direction, the second direction being from the first electrode toward the first semiconductor layer, an impurity concentration of the first semiconductor portion having a maximum at a second position in the second direction, a third position being separated from the upper surface of the first electrode by a length that is 3 times a distance between the second position and a lower end of the third semiconductor layer, the first position being the same as or lower than the third position;
  a fourth semiconductor layer located on the third semiconductor layer in the diode region and located higher than the second semiconductor layer in the IGBT region, the fourth semiconductor layer being of the first conductivity type;
  a fifth semiconductor layer located on the fourth semiconductor layer in the diode region and the IGBT region, the fifth semiconductor layer being of the second conductivity type;
  a sixth semiconductor layer located in an upper layer portion of the fifth semiconductor layer in the IGBT region, the sixth semiconductor layer being of the first conductivity type;
  a second electrode extending from the sixth semiconductor layer toward the fourth semiconductor layer in the IGBT region, the second electrode being next to the sixth semiconductor layer, the fifth semiconductor layer, and the fourth semiconductor layer;
  a third electrode located on the fifth semiconductor layer in the diode region and located on the sixth semiconductor layer in the IGBT region; and
  an insulating film located between the second electrode and the third electrode, between the second electrode and the sixth semiconductor layer, between the second electrode and the fifth semiconductor layer, and between the second electrode and the fourth semiconductor layer.

Configuration 2

The device according to the configuration 1, wherein
  the impurity concentration of the third semiconductor layer gradually increases from the lower end of the third semiconductor layer toward an intermediate point between the lower end and an upper end of the third semiconductor layer,
  the impurity concentration of the third semiconductor layer has a maximum at the intermediate point, and
  the impurity concentration of the third semiconductor layer gradually decreases from the intermediate point toward the upper end.

Configuration 3

The device according to the configuration 1, wherein
  the impurity concentration of the third semiconductor layer has a maximum at the lower end, and
  the impurity concentration of the third semiconductor layer gradually decreases from the lower end toward an upper end of the third semiconductor layer.

Configuration 4

The device according to any one of the configurations 1 to 3, wherein
  a pitch of the plurality of first semiconductor portions and the plurality of second semiconductor portions alternately arranged in the first semiconductor layer is greater than 0 □m and not more than 50 μm.

Configuration 5

The device according to any one of the configurations 1 to 4, wherein
an impurity amount per unit area of the fifth semiconductor layer is not less than $1\times10^{12}$ cm$^{-2}$ and $5\times10^{12}$ cm$^{-2}$.

Configuration 6

The device according to any one of configurations 1 to 5, wherein
at least one of the plurality of second semiconductor portions protrudes further than the first semiconductor portion in the second direction.

Configuration 7

The device according to the configuration 6, wherein
a width of the second semiconductor portion protruding further than the first semiconductor portion is greater than a width of the first semiconductor portion.

Configuration 8

The device according to any one of the configurations 1 to 7, wherein
a thickness of the third semiconductor layer is greater than a thickness of the first semiconductor portion.

Configuration 9

A semiconductor device in which a diode region and an IGBT region are set,
the device comprising:
a first electrode located in the diode region and the IGBT region;
a first semiconductor layer located on the first electrode in the diode region, at least a portion of the first semiconductor layer being transparent, the first semiconductor layer being of a first conductivity type;
a second semiconductor layer located on the first electrode in the IGBT region, the second semiconductor layer being of a second conductivity type;
a third semiconductor layer located on the first semiconductor layer in the diode region and located on the second semiconductor layer in the IGBT region, the third semiconductor layer being of the first conductivity type;
a fourth semiconductor layer located on the third semiconductor layer in the diode region and the IGBT region, the fourth semiconductor layer being of the second conductivity type;
a fifth semiconductor layer located in an upper layer portion of the fourth semiconductor layer in the IGBT region, the fifth semiconductor layer being of the first conductivity type;
a second electrode extending from the fifth semiconductor layer toward the third semiconductor layer in the IGBT region, the second electrode being next to the fifth semiconductor layer, the fourth semiconductor layer, and the third semiconductor layer;
a third electrode located on the fourth semiconductor layer in the diode region and located on the fifth semiconductor layer in the IGBT region; and
an insulating film located between the second electrode and the third electrode, between the second electrode and the fifth semiconductor layer, between the second electrode and the fourth semiconductor layer, and between the second electrode and the third semiconductor layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device in which a diode region and an IGBT region are set, the device comprising:
a lower electrode located in the diode region and the IGBT region;
a first semiconductor layer located on the lower electrode in the diode region, the first semiconductor layer including a plurality of first semiconductor regions and a plurality of second semiconductor regions alternately arranged in a first direction along an upper surface of the lower electrode, the plurality of first semiconductor regions being of a first conductivity type, the plurality of second semiconductor regions being of a second conductivity type;
a second semiconductor layer located on the lower electrode in the IGBT region, the second semiconductor layer being of the second conductivity type;
a cathode layer located on the first semiconductor layer in the diode region, the cathode layer being of the first conductivity type;
a fourth semiconductor layer located on the cathode layer in the diode region and located on the second semiconductor layer in the IGBT region, the fourth semiconductor layer being of the first conductivity type;
a fifth semiconductor layer located on the fourth semiconductor layer in the diode region and the IGBT region, the fifth semiconductor layer being of the second conductivity type;
a sixth semiconductor layer located on the fifth semiconductor layer in the IGBT region, the sixth semiconductor layer being of the first conductivity type;
a gate electrode extending from the sixth semiconductor layer toward the fourth semiconductor layer in the IGBT region, the gate electrode being next to the sixth semiconductor layer, the fifth semiconductor layer, and the fourth semiconductor layer;
an upper electrode located on the fifth semiconductor layer in the diode region and located on the sixth semiconductor layer in the IGBT region;
and an insulating film located between the gate electrode and the upper electrode, between the gate electrode and the sixth semiconductor layer, between the gate electrode and the fifth semiconductor layer, and between the gate electrode and the fourth semiconductor layer,
the plurality of second semiconductor regions of the first semiconductor layer including a first region and a second region, a width of the first region being greater than a width of the second region in the first direction, the width of the first region being greater than a width of the first semiconductor region in the first direction, the first region being apart from the second region in the first direction, and the second region being in direct contact with the cathode layer.

2. The device according to claim 1, wherein a pitch of the plurality of first semiconductor regions and the plurality of second semiconductor regions alternately arranged in the first semiconductor layer is greater than 0 μm and not more than 50 μm.

3. The device according to claim 1, wherein at least one of the plurality of second semiconductor regions protrudes further than the first semiconductor region in a second direction, the second direction being from the lower electrode toward the first semiconductor layer.

4. The device according to claim 3, wherein a width of the second semiconductor region protruding further than the first semiconductor region is greater than a width of the first semiconductor region.

5. The device according to claim 1, wherein a thickness of the cathode layer is greater than a thickness of the first semiconductor region.

6. The device according to claim 1, wherein the first region of the plurality of second semiconductor regions protrudes further than the first semiconductor region in a second direction, the second direction being from the lower electrode toward the first semiconductor layer.

7. The device according to claim 1, wherein the first region of the plurality of second semiconductor regions protrudes further than the second region of the plurality of second semiconductor regions in a second direction, the second direction being from the lower electrode toward the first semiconductor layer.

8. The device according to claim 1, wherein an impurity amount per unit area of the fifth semiconductor layer and a forward voltage of the semiconductor device satisfy a following inequality:

$$0.84 \times Vf^2 - 4.15 \times Vf + 6.10 \leq Qd/10^{12} \leq 0.68 \times Vf^2 - 3.65 \times Vf + 5.85$$

where the impurity amount per unit area of the fifth semiconductor layer is Qd [cm$^{-2}$], and the forward voltage of the semiconductor device is Vf [V].

9. The device according to claim 1, wherein an impurity concentration of the cathode layer has a maximum at a first position in a second direction, the second direction being from the lower electrode toward the first semiconductor layer, an impurity concentration of the first semiconductor region has a maximum at a second position in the second direction, and the first position is the same as or lower than a position which is separated from the upper surface of the lower electrode by a length that is 3 times a distance between the second position and a lower end of the cathode layer.

10. The device according to claim 9, wherein:

the impurity concentration of the cathode layer gradually increases from the lower end of the cathode layer toward an intermediate point between the lower end and an upper end of the cathode layer, the impurity concentration of the cathode layer has a maximum at the intermediate point, and the impurity concentration of the cathode layer gradually decreases from the intermediate point toward the upper end.

11. The device according to claim 9, wherein:

the impurity concentration of the cathode layer has a maximum at the lower end, and the impurity concentration of the cathode layer gradually decreases from the lower end toward an upper end of the cathode layer.

12. The device according to claim 1, wherein a distance along the first direction between the first semiconductor regions facing each other in the first direction via the first region of the second semiconductor regions is greater than a distance along the first direction between the first semiconductor regions facing each other in the first direction via the second region of the second semiconductor regions.

13. The device according to claim 9, wherein the first position is separated from the upper surface of the lower electrode by not less than 0.25 pm and not more than 0.75 pm.

* * * * *